United States Patent
Chu et al.

(10) Patent No.: US 10,367,088 B2
(45) Date of Patent: Jul. 30, 2019

(54) NITRIDE SEMICONDUCTOR DEVICE

(71) Applicant: Nuvoton Technology Corporation, Hsinchu (TW)

(72) Inventors: Kuei-Yi Chu, Hsinchu (TW); Heng-Kuang Lin, Hsinchu (TW); Jung-Tse Tsai, Hsinchu (TW); Shih-Po Lin, Hsinchu (TW); Chih-Wei Chen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/186,593

(22) Filed: Nov. 12, 2018

(65) Prior Publication Data

US 2019/0198653 A1 Jun. 27, 2019

(30) Foreign Application Priority Data

Dec. 25, 2017 (TW) .............................. 106145577 A

(51) Int. Cl.
*H01L 29/778* (2006.01)
*H01L 29/20* (2006.01)
*H01L 29/872* (2006.01)

(52) U.S. Cl.
CPC ...... *H01L 29/7786* (2013.01); *H01L 29/2003* (2013.01); *H01L 29/872* (2013.01)

(58) Field of Classification Search
CPC ............... H01L 29/872; H01L 29/2003; H01L 29/7786
See application file for complete search history.

(56) References Cited

U.S. PATENT DOCUMENTS

| 8,729,603 | B2 | 5/2014 | Ikeda et al. | |
| 9,349,807 | B2 | 5/2016 | Kuraguchi | |
| 9,679,981 | B2 | 6/2017 | Sriram et al. | |
| 2006/0102932 | A1* | 5/2006 | Hwang | H01L 21/8252 257/194 |
| 2010/0117118 | A1* | 5/2010 | Dabiran | H01L 29/207 257/190 |
| 2015/0129888 | A1* | 5/2015 | Nishimori | H01L 29/41725 257/76 |
| 2017/0047437 | A1* | 2/2017 | Nakayama | H01L 21/2258 |

FOREIGN PATENT DOCUMENTS

| CN | 104821340 | 8/2015 |
| CN | 106505102 | 3/2017 |
| TW | 201244093 | 11/2012 |
| TW | I569439 | 2/2017 |
| TW | 201724509 | 7/2017 |

* cited by examiner

*Primary Examiner* — Peniel M Gumedzoe
(74) *Attorney, Agent, or Firm* — JCIPRNET

(57) ABSTRACT

A nitride semiconductor device is provided, including a substrate having a first surface and a second surface opposite to each other; a nucleation layer disposed on the first surface of the substrate; a doped nitride semiconductor layer disposed on the nucleation layer; a doped first buffer layer disposed on the doped nitride semiconductor layer; a channel layer disposed on the doped first buffer layer; a barrier layer disposed on the channel layer; a first electrode disposed on the barrier layer; a second electrode electrically connected to the doped nitride semiconductor layer; and a doped region disposed at least in a portion of the doped nitride semiconductor layer, wherein the doped region is extended from below the first electrode to be partially overlapped with the second electrode.

20 Claims, 4 Drawing Sheets

NITRIDE SEMICONDUCTOR DEVICE

CROSS-REFERENCE TO RELATED APPLICATION

This application claims the priority benefit of Taiwan application no. 106145577, filed on Dec. 25, 2017. The entirety of the above-mentioned patent application is hereby incorporated by reference herein and made a part of this specification.

BACKGROUND OF THE INVENTION

Field of the Invention

The invention relates to a semiconductor device, and more particularly, to a nitride semiconductor device.

Description of Related Art

To provide a power device with properties such as low on-resistance, high switching frequency, high breakdown voltage, and high-temperature operation, the gallium nitride (GaN) semiconductor device is currently a popular choice for power devices. However, during operation, the device is readily subjected to the influence of different bias and pulse conditions such that defects inside the device capture or release electrons. As a result, the on-resistance of the device is changed with the bias condition or operating frequency, thus resulting in a current collapse phenomenon and degrading the dynamic characteristics of the device.

A known technique alleviates the current collapse phenomenon and improves the dynamic characteristics of the device using, for instance, surface passivation or a field plate, but the effects are still limited. Therefore, how to increase the stability of the device is an important issue in the development and commercialization of GaN power device products.

SUMMARY OF THE INVENTION

The invention provides a nitride semiconductor device having a doped nitride semiconductor layer between a nucleation layer and a buffer layer.

A nitride semiconductor device of the invention includes a substrate, a nucleation layer, a doped nitride semiconductor layer, a doped first buffer layer, a channel layer, a barrier layer, a first electrode, and a second electrode. The substrate has a first surface and a second surface opposite to each other. The nucleation layer is disposed on the first surface of the substrate. The doped nitride semiconductor layer is disposed on the nucleation layer. The doped first buffer layer is disposed on the doped nitride semiconductor layer. The channel layer is disposed on the doped first buffer layer. The barrier layer is disposed on the channel layer. The first electrode is disposed on the barrier layer. The second electrode is electrically connected to the doped nitride semiconductor layer. The doped region is at least disposed in a portion of the doped nitride semiconductor layer, wherein the doped region is extended from below the first electrode to be partially overlapped with the second electrode.

In an embodiment of the nitride semiconductor device of the invention, the doped region is, for instance, doped by neutral atoms such as nitrogen (N), argon (Ar), or a combination thereof.

In an embodiment of the nitride semiconductor device of the invention, the doped nitride semiconductor layer is, for instance, a P-type gallium nitride layer.

In an embodiment of the nitride semiconductor device of the invention, the second electrode is, for instance, disposed on the barrier layer.

In an embodiment of the nitride semiconductor device of the invention, the doped first buffer layer exposes a portion of the doped nitride semiconductor layer, the nitride semiconductor device can further include a third electrode, and the third electrode is disposed on the exposed doped nitride semiconductor layer and electrically connected to the second electrode.

In an embodiment of the nitride semiconductor device of the invention, the nitride semiconductor device can further include a fourth electrode disposed on the barrier layer and located between the first electrode and the second electrode.

In an embodiment of the nitride semiconductor device of the invention, the nitride semiconductor device can further include a third electrode disposed on the barrier layer and located between the first electrode and the second electrode.

In an embodiment of the nitride semiconductor device of the invention, the second electrode is, for instance, disposed on the second surface of the substrate.

In an embodiment of the nitride semiconductor device of the invention, the nitride semiconductor device can further include a third electrode disposed on the barrier layer.

In an embodiment of the nitride semiconductor device of the invention, the nitride semiconductor device can further include a fourth electrode disposed on the barrier layer and located between the first electrode and the third electrode.

In an embodiment of the nitride semiconductor device of the invention, the nitride semiconductor device can further include a doped second buffer layer disposed on the nucleation layer, wherein the doping concentrations of the doped first buffer layer and the doped second buffer layer are less than $1 \times 10^{19}/cm^3$.

In an embodiment of the nitride semiconductor device of the invention, the doped region is, for instance, extended from the doped nitride semiconductor layer to the doped first buffer layer or the nucleation layer.

Another nitride semiconductor device of the invention includes a substrate, a nucleation layer, a doped nitride semiconductor layer, a doped first buffer layer, a channel layer, a barrier layer, a first electrode, and a second electrode. The substrate has a first surface and a second surface opposite to each other. The nucleation layer is disposed on the first surface of the substrate. The doped nitride semiconductor layer is disposed on the nucleation layer. The doped first buffer layer is disposed on the doped nitride semiconductor layer, wherein the doping concentration of the doped first buffer layer is $1 \times 10^{19}/cm^3$ or more. The channel layer is disposed on the doped first buffer layer and the barrier layer is disposed on the channel layer. The first electrode is disposed on the barrier layer. The second electrode is electrically connected to the doped nitride semiconductor layer.

In another embodiment of the nitride semiconductor device of the invention, the doped nitride semiconductor layer is, for instance, a P-type gallium nitride layer.

In another embodiment of the nitride semiconductor device of the invention, the second electrode is, for instance, disposed on the barrier layer.

In another embodiment of the nitride semiconductor device of the invention, the nitride semiconductor device can further include a third electrode disposed on the barrier layer and located between the first electrode and the second electrode.

In another embodiment of the nitride semiconductor device of the invention, the nitride semiconductor device can further include a doped region at least disposed in a portion of the doped nitride semiconductor layer, wherein the doped region is extended from below the first electrode to be partially overlapped with the second electrode.

In another embodiment of the nitride semiconductor device of the invention, the doped region is, for instance, extended from the doped nitride semiconductor layer into the doped first buffer layer.

In another embodiment of the nitride semiconductor device of the invention, the doped region is, for instance, extended from the doped nitride semiconductor layer into the nucleation layer.

In another embodiment of the nitride semiconductor device of the invention, the nitride semiconductor device can further include a doped second buffer layer disposed between the nucleation layer and the doped nitride semiconductor layer, wherein the doping concentration of the doped second buffer layer is $1 \times 10^{19}/cm^3$ or more.

Another nitride semiconductor device of the invention includes a substrate, a nucleation layer, a P-type gallium nitride layer, a doped first buffer layer, a channel layer, a barrier layer, a first electrode, a second electrode, a gate electrode, and a doped region. The nucleation layer is disposed on the substrate. The P-type gallium nitride layer is disposed on the nucleation layer. The doped first buffer layer is disposed on the P-type gallium nitride layer. The channel layer is disposed on the doped first buffer layer. The barrier layer is disposed on the channel layer. The first electrode is disposed on the barrier layer. The second electrode is disposed on the barrier layer and electrically connected to P-type gallium nitride layer. The gate electrode is disposed on the barrier layer and located between the first electrode and the second electrode. The doped region is disposed at least in a portion of the P-type gallium nitride layer, wherein the doped region is extended from below the first electrode to be partially overlapped with the second electrode, wherein the doped region is doped by neutral atoms.

Based on the above, in the invention, the doped nitride semiconductor layer is disposed between the nucleation layer and the buffer layer, and the doped nitride semiconductor layer is electrically connected to the electrode, and therefore the current collapse phenomenon can be alleviated or even eliminated. More specifically, during the operation process, when voltage is provided to the doped nitride semiconductor layer via the electrode electrically connected to the doped nitride semiconductor layer, holes can be emitted from the doped nitride semiconductor layer to alleviate the current collapse phenomenon by eliminating electrons captured by defects in the device during the operation process.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
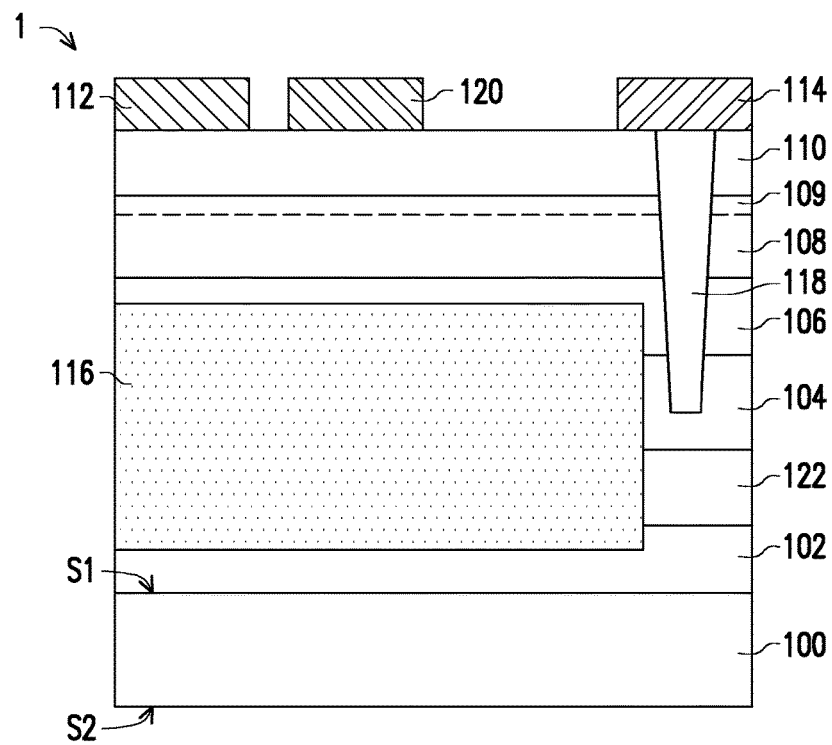
FIG. 1 is a cross section of a nitride semiconductor device used as a field-effect transistor shown according to an embodiment of the invention.

FIG. 1 is a cross section of a nitride semiconductor device used as a field-effect transistor shown according to an embodiment of the invention.

Referring to FIG. 1, a nitride semiconductor device 1 of the invention includes a substrate 100, a nucleation layer 102, a doped nitride semiconductor layer 104, a doped first buffer layer 106, a channel layer 108, a barrier layer 110, a first electrode 112, a second electrode 114, a doped region 116, a contact 118, a third electrode 120, and a doped second buffer layer 122.

The substrate 100 has a first surface S1 and a second surface S2 opposite to each other. In an embodiment, the substrate 100 is, for instance, a silicon (Si) substrate, a silicon carbide (SiC) substrate, a sapphire substrate, or a gallium nitride (GaN) substrate. The nucleation layer 102 is disposed on the first surface S1 of the substrate 100. The material of the nucleation layer 102 is, for instance, a Group III nitride such as AlN, GaN, AlGaN, or a combination thereof.

The doped nitride semiconductor layer 104 is disposed on the nucleation layer 102. The doped nitride semiconductor layer 104 is, for instance, a P-type GaN layer. In the present embodiment, to avoid the issue of dopant diffusion, a doped first buffer layer 106 is disposed on the doped nitride semiconductor layer 104. The material of the doped first buffer layer 106 is, for instance, a Group III-V compound such as a Group III nitride. The dopant of the doped first buffer layer 106 is, for instance, carbon (C), iron (Fe), or a combination thereof to increase the resistance of the doped first buffer layer 106. In the present embodiment, the doping concentration of the doped first buffer layer 106 is less than $1 \times 10^{19}/cm^3$.

The channel layer 108 is disposed on the doped first buffer layer 106. The material of the channel layer 108 is, for instance, GaN. The barrier layer 110 is disposed on the channel layer 108. The material of the barrier layer 110 is, for instance, AlGaN, AlInN, AlN, AlGaInN, or a combination thereof. The channel layer 108 has a two-dimensional electron gas (2DEG) 109 located below the interface of the channel layer 108 and the barrier layer 110.

The first electrode 112, the second electrode 114, and the third electrode 120 are disposed on the barrier layer 110, and the third electrode 120 is located between the first electrode 112 and the second electrode 114, wherein the second electrode 112 is electrically connected to the doped nitride semiconductor layer 104 via the contact 118 passing through the barrier layer 110, the channel layer 108, and the doped first buffer layer 106. In the present embodiment, the contact 118 is extended into the doped nitride semiconductor layer 104, but the invention is not limited thereto. In other embodiments, the contact 118 can also be in contact with the surface of the doped nitride semiconductor layer 104. Moreover, in the present embodiment, the nitride semiconductor device 1 is used as a field-effect transistor, and therefore the first electrode 112 can be regarded as a source, the second electrode 114 can be regarded as a drain, and the third electrode 120 can be regarded as a gate. As a result, the material of the first electrode 112 and the second electrode 114 is, for instance, Al, Ti, Au, or an alloy thereof or other materials that can form an Ohmic contact with a Group III-V compound, and the material of the third electrode 120 is, for instance, Ni, Mo, W, TiN, or a combination thereof.

The second buffer layer 122 is disposed between the nucleation layer 102 and the doped nitride semiconductor layer 104. The dopant of the doped second buffer layer 122 is, for instance, C, Fe, or a combination thereof to increase the resistance of the doped second buffer layer 122. In the present embodiment, the doping concentration of the doped second buffer layer 122 is less than $1 \times 10^{19}/cm^3$. The material of the doped second buffer layer 122 can be the same or different as that of the doped first buffer layer 106, and the invention is not limited in this regard. In other embodiments, the doped second buffer layer 122 can also be omitted based on actual need.

The doped region 116 is disposed in a portion of the doped nitride semiconductor layer 104, wherein the dopant in the doped region 116 is, for instance, a neutral atom such as nitrogen (N), argon (Ar), or a combination thereof. As a result, the doped region 116 can have sufficient resistance. The doped region 116 is laterally extended from below the first electrode 112 to below the second electrode 114 and partially overlapped with the second electrode 114. In the present embodiment, the doped region 116 is not only located in the doped nitride semiconductor layer 104 but also extended from the doped nitride semiconductor layer 104 to the doped first buffer layer 106 and passes through the doped second buffer layer 122 to the nucleation layer 102.

During the operation of the nitride semiconductor device 1, when voltage is applied to the second electrode 114, since the doped nitride semiconductor layer 104 is electrically connected to the second electrode 114 via the contact 118, holes can be emitted from the doped nitride semiconductor layer 104 and travel toward electrons captured by defects in the nitride semiconductor device 1 to be combined with the electrons. As a result, negative charge from the electrons captured by the defects can be eliminated, and therefore the current collapse phenomenon can be alleviated or even eliminated. Moreover, since the doped region 116 has sufficient resistance and is only partially overlapped with the second electrode 114, the travel path of the holes toward the electrons captured by the defect can be effectively limited to increase the effect of alleviating or even eliminating the current collapse phenomenon. Moreover, by disposing the doped region 116 in the doped nitride semiconductor layer 104, leakage current can be effectively prevented.

Figure 2:
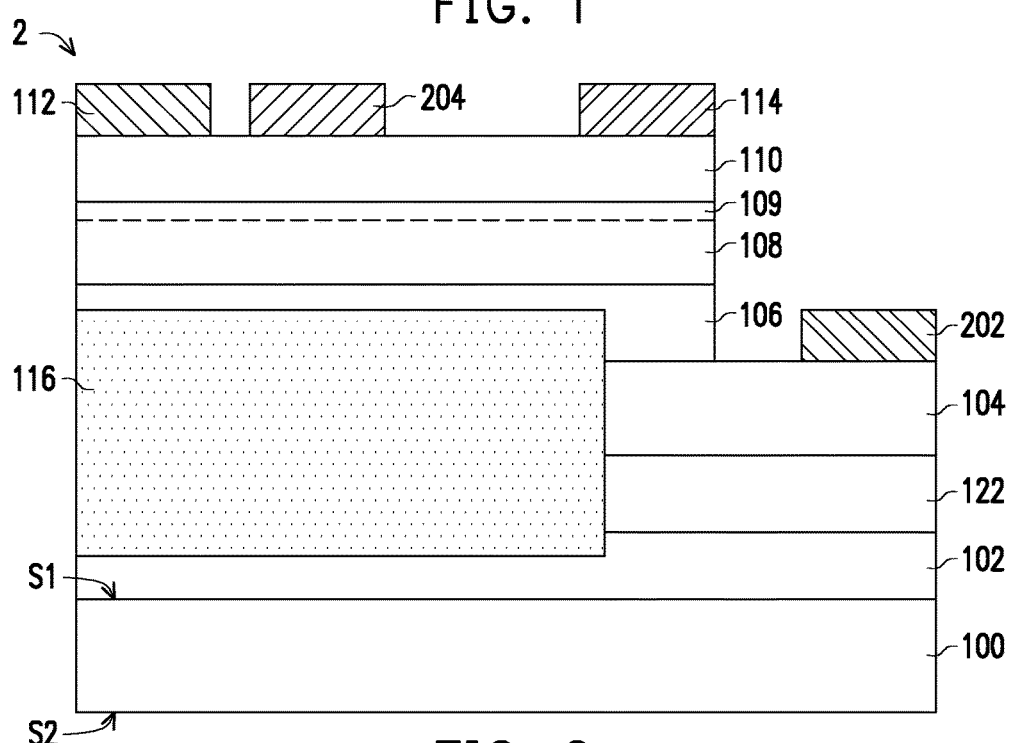
FIG. 2 is a cross section of a field-effect transistor of a nitride semiconductor device used as a field-effect transistor shown according to another embodiment of the invention.

FIG. 2 is a cross section of a field-effect transistor of a nitride semiconductor device used as a field-effect transistor shown according to another embodiment of the invention. In FIG. 2, the same devices as FIG. 1 are represented by the same reference numerals and descriptions thereof are omitted. Referring to FIG. 2, the difference between a nitride semiconductor device 2 and the nitride semiconductor device 1 is that, in the nitride semiconductor device 2, a portion of the doped nitride semiconductor layer 104 is exposed by stacked layers formed by the doped first buffer layer 106, the channel layer 108, and the barrier layer 110, and the third electrode 202 is disposed on a portion of the exposed doped nitride semiconductor layer 104 and electrically connected to the second electrode 114. Moreover, a fourth electrode 204 is disposed on the barrier layer 110 and located between the first electrode 112 and the second electrode 114.

In the present embodiment, the nitride semiconductor device 2 is used as a field-effect transistor, and therefore the first electrode 112 can be regarded as a source, the second electrode 114 can be regarded as a drain, and the fourth electrode 204 can be regarded as a gate. The material of the third electrode 202 is, for instance, Al, Ti, Ni, Au, or an alloy thereof or other materials that can form an Ohmic contact with a Group III-V compound, and the material of the fourth electrode 204 is, for instance, Ni, Mo, W, TiN, or a combination thereof.

Similar to the nitride semiconductor device 1, during the operation of the nitride semiconductor device 2, when voltage is applied to the second electrode 114, since the doped nitride semiconductor layer 104 is electrically connected to the second electrode 114 via the third electrode 202 electrically connected to the second electrode 114, an holes can be emitted from the doped nitride semiconductor layer 104 and travel toward electrons captured by defects in the nitride semiconductor device 2 to be combined with the electrons. As a result, negative charge from the electrons captured by the defects can be eliminated, and therefore the current collapse phenomenon can be alleviated or even eliminated. Moreover, since the doped region 116 has sufficient resistance and is only partially overlapped with the second electrode 114, the travel path of the holes toward the electrons captured by the defects can be effectively limited to increase the effect of alleviating or even eliminating the current collapse phenomenon. Moreover, by disposing the doped region 116 in the doped nitride semiconductor layer 104, leakage current can be effectively prevented.

Figure 3:
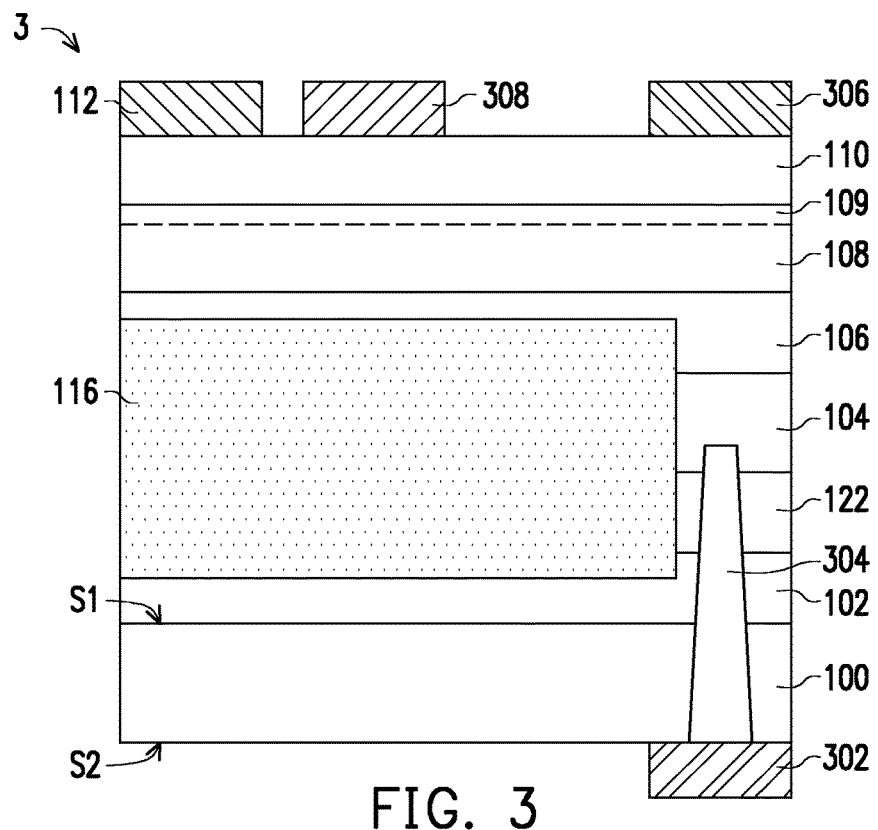
FIG. 3 is a cross section of a nitride semiconductor device used as a field-effect transistor shown according to another embodiment of the invention.

FIG. 3 is a cross section of a field-effect transistor of a nitride semiconductor device used as a field-effect transistor shown according to another embodiment of the invention. In FIG. 3, the same devices as FIG. 1 are represented by the same reference numerals and descriptions thereof are omitted. Referring to FIG. 3, the difference between a nitride semiconductor device 3 and the nitride semiconductor device 1 is that, in the nitride semiconductor device 3, a second electrode 302 is disposed below the second surface S2 of the substrate 100 and extended in the doped nitride semiconductor layer 104 via a contact 304. Moreover, a third electrode 306 is located on the barrier layer 110 and electrically connected to the second electrode 302, and a fourth electrode 308 is disposed between the first electrode 112 and the third electrode 306.

In the present embodiment, the nitride semiconductor device 3 is used as a field-effect transistor, and therefore the first electrode 112 can be regarded as a source, the third electrode 306 can be regarded as a drain, and the fourth electrode 308 can be regarded as a gate. The material of the second electrode 302 and the third electrode 306 is, for instance, Al, Ti, Ni, Au, or an alloy thereof or other materials that can form an Ohmic contact with a Group III-V compound, and the material of the fourth electrode 308 is, for instance, Ni, Mo, W, TiN, or a combination thereof.

Similar to the nitride semiconductor device 1, during the operation for the nitride semiconductor device 3, when voltage is applied to the third electrode 306, since the doped nitride semiconductor layer 104 is electrically connected to the third electrode 306 via the contact 304 and the second electrode 302 electrically connected to the third electrode 306, holes can be emitted from the doped nitride semiconductor layer 104 and travel toward electrons captured by defects in the nitride semiconductor device 3 to be combined with the electrons. As a result, negative charge from the electrons captured by the defects can be eliminated, and therefore the current collapse phenomenon can be alleviated or even eliminated. Moreover, since the doped region 116 has sufficient resistance and is only partially overlapped with the second electrode 302, the travel path of the holes toward the electrons captured by the defects can be effectively limited to increase the effect of alleviating or even eliminating the current collapse phenomenon. Moreover, by disposing the doped region 116 in the doped nitride semiconductor layer 104, leakage current can be effectively prevented.

Figure 4:
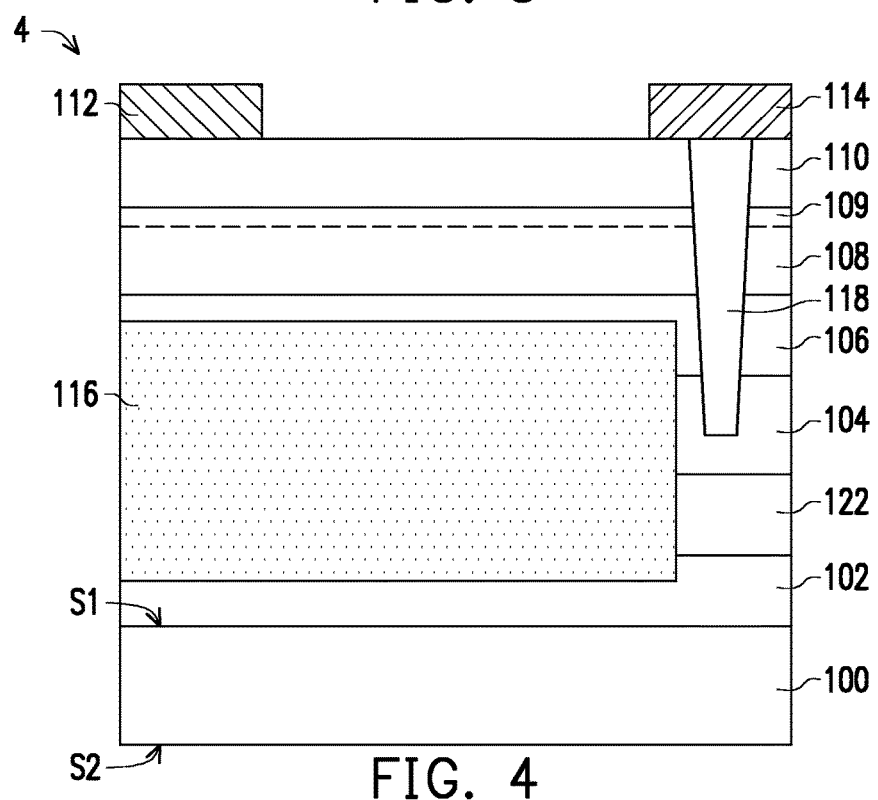
FIG. 4 is a cross section of a nitride semiconductor device used as a Schottky diode shown according to another embodiment of the invention.
Figure 5:
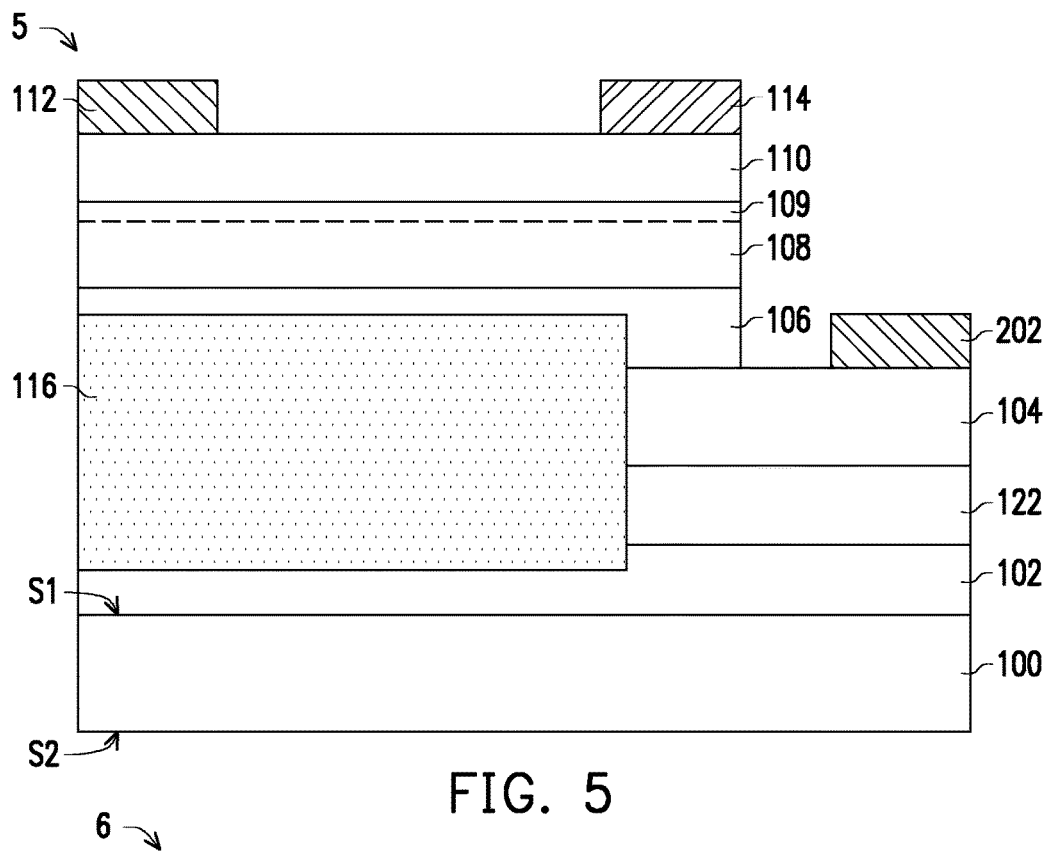
FIG. 5 is a cross section of a nitride semiconductor device used as a Schottky diode shown according to another embodiment of the invention.
Figure 6:
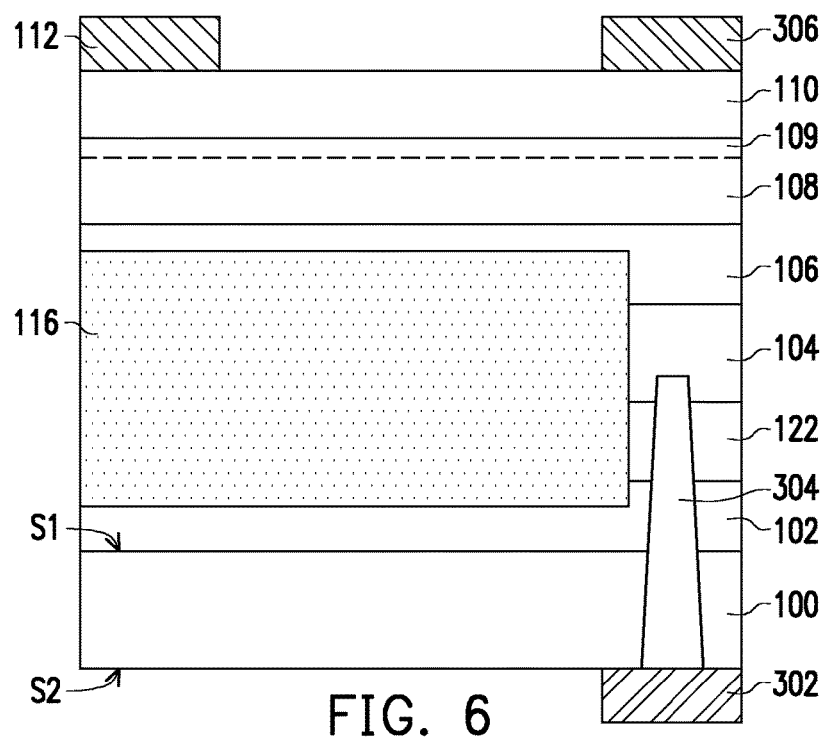
FIG. 6 is a cross section of a nitride semiconductor device used as a Schottky diode shown according to another embodiment of the invention.

FIG. 4 to FIG. 6 are cross sections of a nitride semiconductor device used as a Schottky diode shown according to an embodiment of the invention. In FIG. 4 to FIG. 6, the same devices as FIG. 1 to FIG. 3 are represented by the same reference numerals and descriptions thereof are omitted.

In FIG. 4, the difference between a nitride semiconductor device 4 and the nitride semiconductor device 1 is that, in the nitride semiconductor device 4, a third electrode is omitted between the first electrode 112 and the second electrode 114, and the nitride semiconductor device 4 is used as a Schottky diode, and therefore the first electrode 112 can be regarded as an anode and the second electrode 114 can be regarded as a cathode. At this point, the material of the first electrode 112 is, for instance, Ni, W, Mo, TiN, or a combination thereof, and the material of the second electrode 114 is, for instance, Ti, Al, or a combination thereof.

In FIG. 5, the difference between a nitride semiconductor device 5 and the nitride semiconductor device 1 is that, in the nitride semiconductor device 5, a third electrode is omitted between the first electrode 112 and the second electrode 114, and the nitride semiconductor device 5 is used as a Schottky diode, and therefore the first electrode 112 can be regarded as an anode and the second electrode 114 can be regarded as a cathode. At this point, the material of the first electrode 112 is, for instance, Ni, W, Mo, TiN, or a combination thereof, and the material of the second electrode 114 and the third electrode 202 is, for instance, Ti, Al, or a combination thereof.

In FIG. 6, the difference between a nitride semiconductor device 6 and the nitride semiconductor device 3 is that, in the nitride semiconductor device 6, a fourth electrode is omitted between the first electrode 112 and the third electrode 306, and the nitride semiconductor device 6 is used as a Schottky diode, and therefore the first electrode 112 can be regarded as an anode and the third electrode 306 can be regarded as a cathode. At this point, the material of the first electrode 112 is, for instance, Ni, W, Mo, TiN, or a combination thereof, and the material of the second electrode 302 and the third electrode 306 is, for instance, Ti, Al, or a combination thereof.

Figure 7:
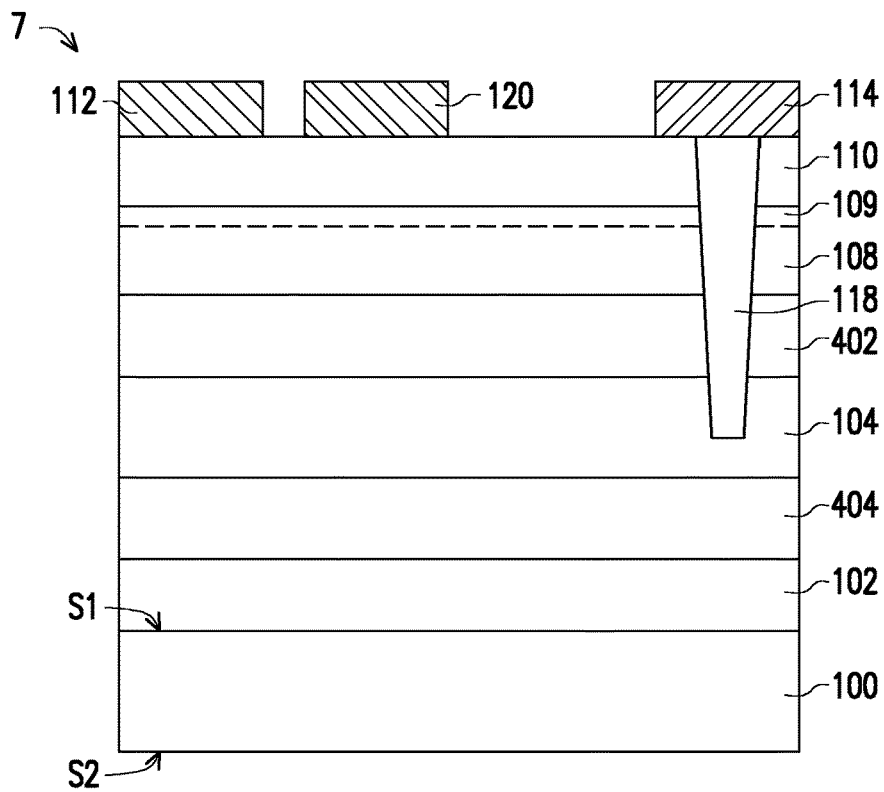
FIG. 7 is a cross section of a nitride semiconductor device used as a field-effect transistor shown according to another embodiment of the invention.

FIG. 7 is a cross section of a nitride semiconductor device used as a field-effect transistor shown according to another embodiment of the invention. In FIG. 7, the same devices as FIG. 1 are represented by the same reference numerals and descriptions thereof are omitted. Referring to FIG. 7, the difference between a nitride semiconductor device 7 and the nitride semiconductor device 1 is that, in the nitride semiconductor device 7, the doping concentrations of a doped first buffer layer 402 and a doped second buffer layer 404 are $1 \times 10^{19}/cm^3$ or more, and the doped region 116 is omitted. Since the doping concentration of the doped first buffer layer 402 is $1 \times 10^{19}/cm^3$ or more, the doped first buffer layer 402 has high resistance, and therefore in comparison to the nitride semiconductor device 1, the doped region 116 can be omitted in the nitride semiconductor device 7 to achieve a similar effect. Of course, in other embodiments, the doped region 116 can also be added.

Figure 8:
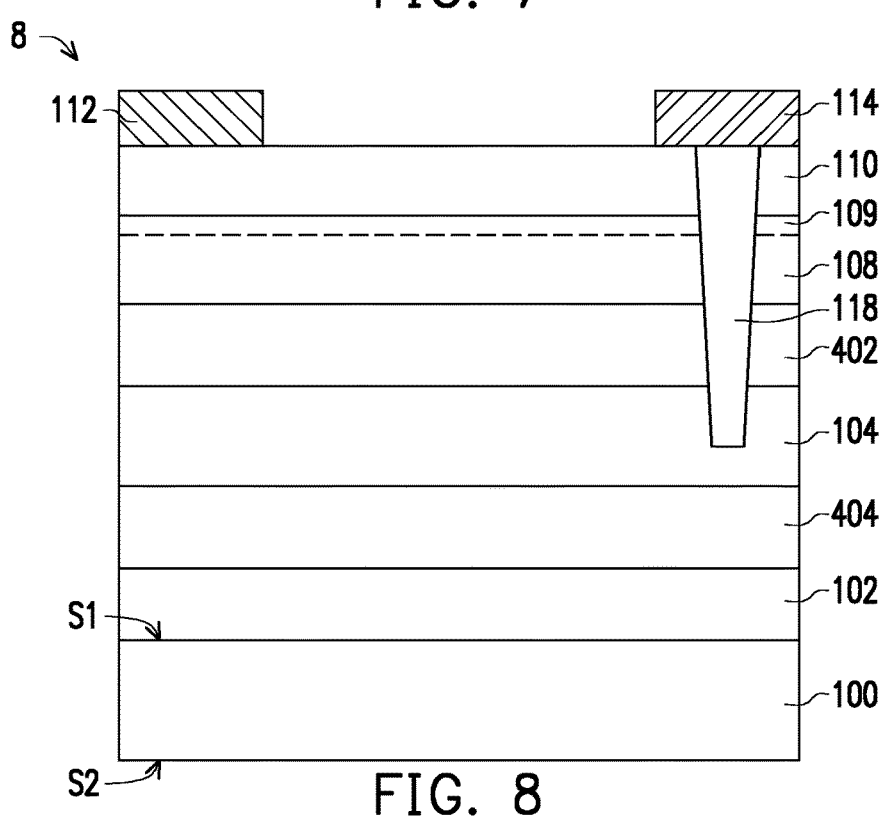
FIG. 8 is a cross section of a nitride semiconductor device used as a Schottky diode shown according to another embodiment of the invention.

FIG. 8 is a cross section of a nitride semiconductor device used as a Schottky diode shown according to another embodiment of the invention. In FIG. 8, the same devices as FIG. 4 are represented by the same reference numerals and descriptions thereof are omitted. Referring to FIG. 8, the difference between a nitride semiconductor device 8 and the nitride semiconductor device 4 is that, in the nitride semiconductor device 8, the doping concentrations of the doped first buffer layer 402 and the doped second buffer layer 404 are $1 \times 10^{19}/cm^3$ or more, and the doped region 116 is omitted. Since the doping concentration of the doped first buffer layer 402 is $1 \times 10^{19}/cm^3$ or more, the doped first buffer layer 402 has high resistance, and therefore in comparison to the nitride semiconductor device 4, the doped region 116 can be omitted in the nitride semiconductor device 8 to achieve a similar effect. Of course, in other embodiments, the doped region 116 can also be added.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A nitride semiconductor device, comprising:
   a substrate having a first surface and a second surface opposite to each other;
   a nucleation layer disposed on the first surface of the substrate;
   a doped nitride semiconductor layer disposed on the nucleation layer;
   a doped first buffer layer disposed on the doped nitride semiconductor layer, wherein the doped first buffer layer is doped by a dopant comprising carbon (C), iron (Fe), or a combination thereof;
   a channel layer disposed on the doped first buffer layer, wherein the doped first buffer layer is disposed between the doped nitride semiconductor layer and the channel layer;
   a barrier layer disposed on the channel layer;
   a first electrode disposed on the barrier layer;
   a second electrode electrically connected to the doped nitride semiconductor layer; and
   a doped region disposed at least in a portion of the doped nitride semiconductor layer, wherein the doped region is extended from below the first electrode to be partially overlapped with the second electrode.
2. The nitride semiconductor device of claim 1, wherein the doped region is doped by neutral atoms comprising nitrogen (N), argon (Ar), or a combination thereof.

3. The nitride semiconductor device of claim 1, wherein the doped nitride semiconductor layer is a P-type gallium nitride layer.

4. The nitride semiconductor device of claim 1, wherein the second electrode is disposed on the barrier layer.

5. The nitride semiconductor device of claim 4, wherein the doped first buffer layer exposes a portion of the doped nitride semiconductor layer, the nitride semiconductor device further comprises a third electrode, and the third electrode is disposed on the exposed doped nitride semiconductor layer and electrically connected to the second electrode.

6. The nitride semiconductor device of claim 5, further comprising a fourth electrode disposed on the barrier layer and located between the first electrode and the second electrode.

7. The nitride semiconductor device of claim 4, further comprising a third electrode disposed on the barrier layer and located between the first electrode and the second electrode.

8. The nitride semiconductor device of claim 1, wherein the second electrode is disposed on the second surface of the substrate, the nitride semiconductor device further comprises a third electrode, and the third electrode is disposed on the barrier layer.

9. The nitride semiconductor device of claim 8, further comprising a fourth electrode disposed on the barrier layer and located between the first electrode and the third electrode.

10. The nitride semiconductor device of claim 1, further comprising a doped second buffer layer disposed between the nucleation layer and the doped nitride semiconductor layer, wherein doping concentrations of the doped first buffer layer and the doped second buffer layer are less than $1 \times 10^{19}/cm^3$.

11. The nitride semiconductor device of claim 1, wherein the doped region is extended from the doped nitride semiconductor layer to the doped first buffer layer or the nucleation layer.

12. A nitride semiconductor device, comprising:
a substrate having a first surface and a second surface opposite to each other;
a nucleation layer disposed on the first surface of the substrate;
a doped nitride semiconductor layer disposed on the nucleation layer;
a doped first buffer layer disposed on the doped nitride semiconductor layer, wherein the doped first buffer layer is doped by a dopant comprising carbon (C), iron (Fe), or a combination thereof, and a doping concentration of the doped first buffer layer is $1 \times 10^{19}/cm^3$ or more;
a channel layer disposed on the doped first buffer layer, wherein the doped first buffer layer is disposed between the doped nitride semiconductor layer and the channel layer;
a barrier layer disposed on the channel layer;
a first electrode disposed on the barrier layer; and
a second electrode electrically connected to the doped nitride semiconductor layer.

13. The nitride semiconductor device of claim 12, wherein the doped nitride semiconductor layer is a P-type gallium nitride layer.

14. The nitride semiconductor device of claim 12, wherein the second electrode is disposed on the barrier layer.

15. The nitride semiconductor device of claim 14, further comprising a third electrode disposed on the barrier layer and located between the first electrode and the second electrode.

16. The nitride semiconductor device of claim 12, further comprising a doped region at least disposed in a portion of the doped nitride semiconductor layer, wherein the doped region is extended from below the first electrode to be partially overlapped with the second electrode.

17. The nitride semiconductor device of claim 16, wherein the doped region is extended from the doped nitride semiconductor layer into the doped first buffer layer.

18. The nitride semiconductor device of claim 16, wherein the doped region is extended from the doped nitride semiconductor layer into the nucleation layer.

19. The nitride semiconductor device of claim 11, further comprising a doped second buffer layer disposed between the nucleation layer and the doped nitride semiconductor layer, wherein a doping concentration of the doped second buffer layer is $1 \times 10^{19}/cm^3$ or more.

20. A nitride semiconductor device, comprising:
a substrate;
a nucleation layer disposed on the substrate;
a P-type gallium nitride layer disposed on the nucleation layer;
a doped first buffer layer disposed on the P-type gallium nitride layer, wherein the doped first buffer layer is doped by a dopant comprising carbon (C), iron (Fe), or a combination thereof;
a channel layer disposed on the doped first buffer layer, wherein the doped first buffer layer is disposed between the P-type gallium nitride layer and the channel layer;
a barrier layer disposed on the channel layer;
a first electrode disposed on the barrier layer;
a second electrode disposed on the barrier layer and electrically connected to P-type gallium nitride layer;
a gate electrode disposed on the barrier layer and located between the first electrode and the second electrode; and
a doped region disposed at least in a portion of the P-type gallium nitride layer, wherein the doped region is extended from below the first electrode to be partially overlapped with the second electrode, wherein the doped region is doped by neutral atoms.

* * * * *